United States Patent
Risler et al.

(10) Patent No.: US 6,425,115 B1
(45) Date of Patent: Jul. 23, 2002

(54) AREA EFFICIENT DELAY CIRCUITS

(75) Inventors: Daniel A. Risler, Austin; Scott K. Herrington, Round Rock, both of TX (US)

(73) Assignee: ESS Technology, Inc., Fremont, CA (US)

(*) Notice: Subject to any disclaimer, the term of this patent is extended or adjusted under 35 U.S.C. 154(b) by 0 days.

(21) Appl. No.: 09/567,862

(22) Filed: May 9, 2000

(51) Int. Cl.[7] .................................................. G06F 17/50
(52) U.S. Cl. .................................. 716/17; 716/2; 716/6
(58) Field of Search .............................. 716/17, 2, 8, 1, 716/6, 9–11

(56) References Cited

U.S. PATENT DOCUMENTS

| | | | | |
|---|---|---|---|---|
| 5,553,008 A | * | 9/1996 | Huang et al. ................ | 364/578 |
| 5,553,276 A | * | 9/1996 | Dean ........................... | 395/550 |
| 5,619,420 A | | 4/1997 | Bried .......................... | 364/491 |
| 5,763,907 A | * | 6/1998 | Dallavalle et al. ........... | 257/202 |
| 5,787,008 A | | 7/1998 | Pullela et al. ................ | 364/489 |
| 5,796,624 A | * | 8/1998 | Sridhar et al. ............... | 364/489 |
| 5,808,956 A | * | 9/1998 | Maruyama ............. | 365/230.06 |
| 5,886,901 A | | 3/1999 | Magoshi ...................... | 364/490 |
| 6,074,429 A | * | 6/2000 | Pullela et al. ................... | 716/6 |
| 6,087,875 A | * | 7/2000 | Defazio ....................... | 327/276 |
| 6,209,122 B1 | * | 3/2001 | Jyu et al. ....................... | 716/6 |
| 6,340,825 B1 | * | 1/2002 | Shibata et al. .............. | 257/207 |

OTHER PUBLICATIONS

Cappuccino et al, "CMOS Buffer Sizing for Long On–Chip Interconnects," IEEEE, Oct. 1998, pp. 1937–1938.*
Abhijit Das, "On the Transistor Sizing Problem," IEEE, Jan. 2000, pp. 1–4.*
Wroblewski et al, "Automatic Transistor Sizing Algorithm for Minimizing Spurious Switching Activities in CMOS Circuits," IEEE, May 2000, pp. III–291–III–294.*

*Principles of CMOS VLSI Design, A Systems Perspective*, 2nd Ed., ©1993, pp. 282, 288.
*Principles of CMOS VLSI Design, A Systems Perspective*, 1st Ed., ©1985, pp. 175–203.

* cited by examiner

Primary Examiner—Vuthe Siek
(74) *Attorney, Agent, or Firm*—Conley, Rose & Tayon PC

(57) ABSTRACT

The present invention provides a library of cells that can be stored in a computer readable memory and used in the computer-aided design of integrated circuits. Some of the cells in this cell library describe circuits having variable delays. In this cell library, two different cells are able to represent circuits that can be configured to delay signal transmission by different time periods while still being contained within substantially equal areas on a silicon substrate. One way that the cell library allows for such a configuration is if the two cells both represent a delay circuits that contains an n-channel transistor coupled to a p-channel transistor. Each n-channel and p-channel transistor has an n- or p-channel gate respectively, and this gate can be described as having a length and a width. When the length of the n-channel gate in the first delay circuit differs from the length of the n-channel gate in the second delay circuit, the delay time associated with each circuit will also differ. For example, if the length of the n-channel gate in the first circuit is longer than that of the n-channel gate in the second circuit, the first circuit can have a longer delay than the second. Furthermore, the cells may also represent a delay circuit that has a capacitor coupled to the n- and p-channel transistors. If so, the delay of the circuit can be further modified by changing the size of this capacitor. These changes in n-channel gate length and capacitor size can be made while still occupying an area on the silicon substrate that is equal or substantially equal to the area occupied by the unchanged circuit. Alternately, the library could allow designers to modify the cells such that the circuits represented by the cells differ in delay time periods and occupy areas on the substrate that differ in breadth but not in height.

31 Claims, 7 Drawing Sheets

AREA EFFICIENT DELAY CIRCUITS

BACKGROUND OF THE INVENTION

1. Field of the Invention

The present invention relates to semiconductor integrated circuit design and, more particularly, to the design and use of delay circuits having increased propagation delays and minimized substrate surface area consumption.

2. Description of the Relevant Art

Integrated circuits are composed of interconnected components, such as transistors, which are fabricated onto a silicon substrate using well-known semiconductor manufacturing techniques. In today's integrated circuits, electronic signals can be transmitted at ever increasing rates of speed. Simultaneously, circuits have become increasingly smaller. While this allows the circuits to perform more quickly and more efficiently than possible when compared with previous technology, the combination of increased speed and reduced size presents several challenges for design engineers. For example, the increased speed sometimes causes signals to arrive at their intended destination at an earlier than expected time, causing the circuit to operate incorrectly.

Today's integrated circuits are very complex. In the design process, computer-aided design and computer aided engineering software tools are often employed. These tools are used to generate netlist and schematic representations of complicated integrated circuits. A netlist is a text file describing the integrated circuit. A netlist representation can be translated into a computer generated schematic representation and vice versa. Schematics often consist of cells interconnected by nets that collectively and visually demonstrate the functional design of the integrated circuit. Cells are selected from a library of cells and represent circuits consisting of logic gates. The logic gates, e.g. NOT gates (inverters), NAND gates, flip flops, buffers and the like, are themselves abstractions of more basic elements, such as transistors and resistors.

Standard cell based design is a common method for implementing computer-aided designs of integrated circuits. In standard cell based design, standard cells typically have a height that is a multiple of a standard height and a variable breadth. The breadth and the standard height are multiples of the vertical and horizontal routing grids respectively.

Timing violations, as noted above, may arise in integrated circuits when signals arrive at the wrong time and cause the circuit to function improperly. Fixing timing violations may require that a signal be delayed. One common type of timing violation is a hold time violation. Some circuits, like flip-flops, require that an input signal remain stable for a minimum time after a clock signal is received in order for that input signal to correctly propagate through the circuit. This minimum time is called the hold time. When the signal is not stable for the hold time, a hold time violation has occurred. A common way of fixing hold time violations involves placing a delay in the signal path so that the signal will remain stable during the hold time.

Area efficiency is critical in integrated circuit design—a reduction in integrated circuit area translates into higher production yields that in turn improve product profitability. One problem with adding delay elements is that they increase the amount of space required by the circuit containing them. For example, designers often insert buffer cells into a path to delay a signal. These buffer cells output the same signal that was input after a certain time period. Unfortunately, these buffer cells have been designed to have very small delays. This means that when a large delay is needed to fix a timing violation, a large number of buffers would have to be placed in the signal's path. For example, a buffer might have a delay of 200 ps and a size of 3 grids. If a delay of 2 ns is needed, 10 buffers would have to be placed in the path and these buffers would take up 30 grids.

SUMMARY OF THE INVENTION

The present invention provides a library of cells that can be stored in a computer readable memory and used in the computer-aided design of integrated circuits. Some of the cells in this cell library describe circuits having variable delays. In this cell library, two different cells are able to represent circuits that can be configured to delay signal transmission by different time periods while still being contained within substantially equal areas on a silicon substrate. One way that the cell library allows for such a configuration is if the two cells both represent a delay circuits that contains an n-channel transistor coupled to a p-channel transistor. Each n-channel and p-channel transistor has an n- or p-channel gate respectively, and this gate can be described as having a length and a width. When the length of the n-channel gate in the first delay circuit differs from the length of the n-channel gate in the second delay circuit, the delay time associated with each circuit will also differ. For example, if the length of the n-channel gate in the first circuit is longer than that of the n-channel gate in the second circuit, the first circuit can have a longer delay than the second. Furthermore, the cells may also represent a delay circuit that has a capacitor coupled to the n- and p-channel transistors. If so, the delay of the circuit can be further modified by changing the size of this capacitor. These changes in n-channel gate length and capacitor size can be made while still occupying an area on the silicon substrate that is equal or substantially equal to the area occupied by the unchanged circuit. Alternately, the library could allow designers to modify the cells such that the circuits represented by the cells differ in delay time periods and occupy areas on the substrate that differ in breadth but not in height.

BRIEF DESCRIPTION OF THE DRAWINGS

Other objects and advantages of the invention will become apparent upon reading the following detailed description and upon reference to the accompanying drawings in which.

Figure 1A:
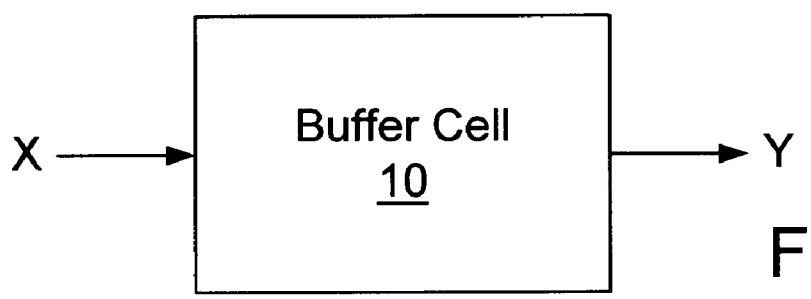
FIG. 1A is a gate level schematic diagram of a standard buffer cell as is found in computer aided design or computer aided engineering libraries.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1B:
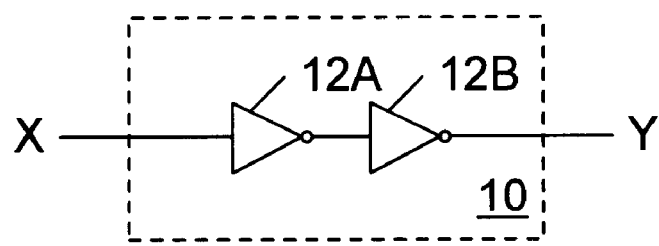
FIG. 1B is the buffer cell of FIG. 1A implemented by two inverters.
Figure 1C:
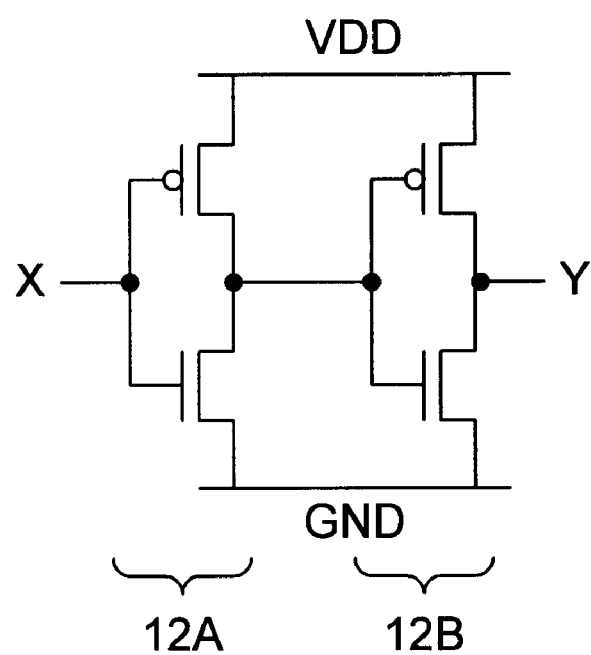
FIG. 1C is a transistor level schematic diagram of the cell of FIG. 1B.

FIG. 1A shows a block diagram of buffer cell 10. FIG. 1B shows a logic level diagram of one embodiment of buffer cell 10. In FIG. 1B, buffer cell 10 is constructed from two inverters, 12A and 12B. FIG. 1C shows a transistor level diagram of cell 10 from FIG. 1B. The first transistor pair implements inverter 12A, while the second transistor pair implements transistor 12B.

Figure 1D:
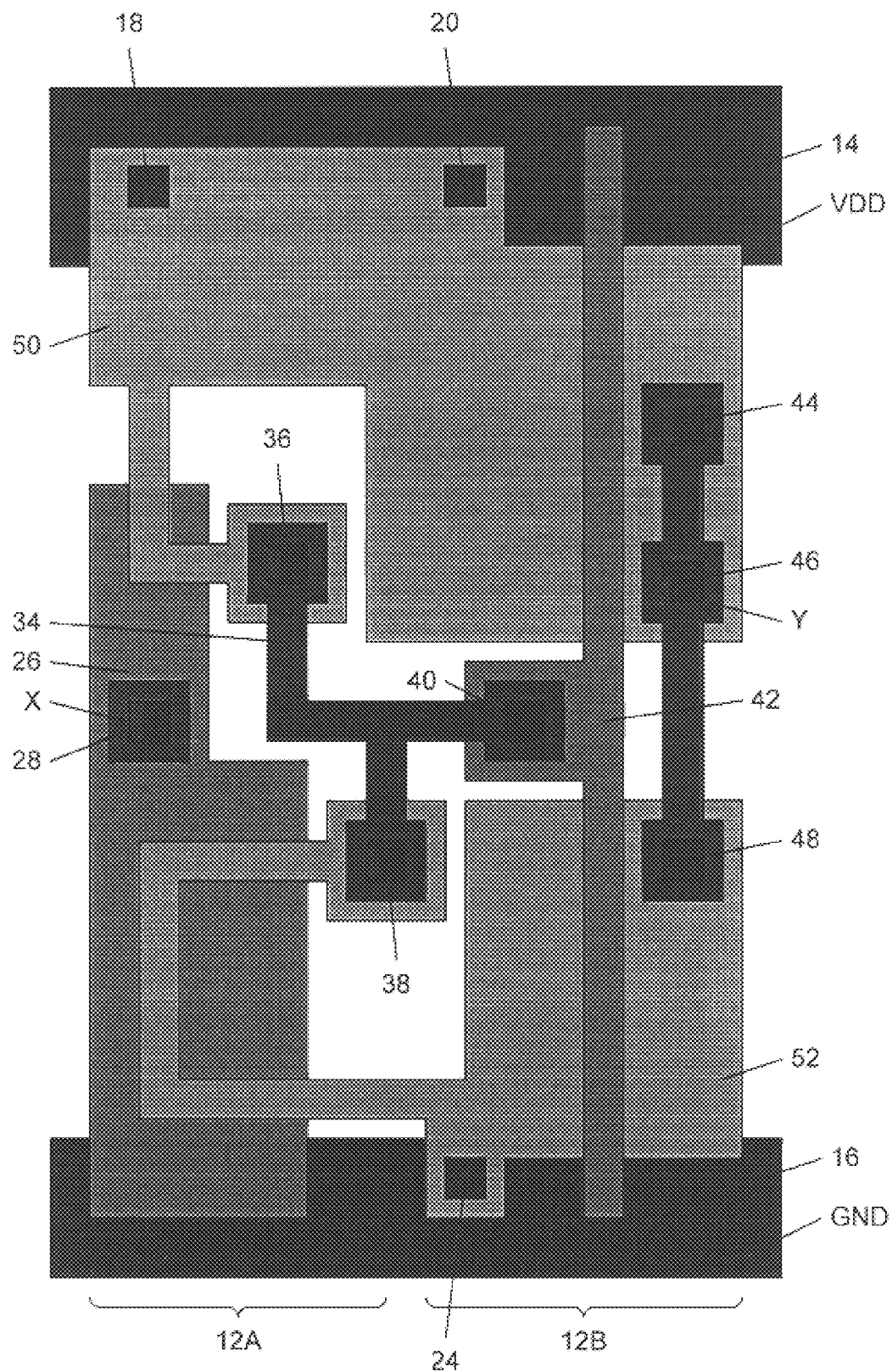
FIG. 1D is a semiconductor layout pattern for the cell of FIG. 1C having a minimized propagation delay.

FIG. 1D shows a semiconductor layout diagram of cell 10 from FIGS. 1B and 1C. In this figure, the inverter 12A includes a portion of diffusion layer 50. Diffusion layer 50 in this example is connected to metal layer 14 via contacts 18 and 20. Metal layer 14 is typically coupled to a positive voltage source Vdd. Inverter 12A also includes a portion of diffusion layer 52. Diffusion layer 52 in this example is coupled to metal layer 16 via contact 24. Metal layer 16 is typically coupled to ground.

Inverter 12A includes input pin X for receiving an input signal. Input X is connected to polysilicon layer 26 via contact 28. Inverter 12A includes a p-channel transistor and an n-channel transistor. The p-channel transistor includes a p-channel gate formed by the overlap of polysilicon layer 26 and diffusion layer 50. Similarly, the n-channel transistor includes an n-channel gate formed where polysilicon layer 26 overlaps diffusion layer 52.

The output of inverter 12A is represented by metal layer 34. Metal layer 34 is connected to diffusion layers 50 and 52 via contacts 36 and 38, respectively. Metal layer 34 also represents the input to inverter 12B. Inverter 12B is coupled to receive its input signal on metal layer 34 via contact 40. Inverter 12B includes an n-channel transistor and a p-channel transistor. The p-channel transistor includes a p-channel gate formed by the overlap of polysilicon layer 42 and diffusion layer 50. The n-channel transistor gate of inverter 12B is formed by the overlap of diffusion layer 52 and polysilicon layer 42. The inverter 12B is coupled to produce an output signal at output pin Y. Output pin Y is connected to diffusion layer 50 by contacts 44 and 46. Output pin Y is also connected to diffusion layer 52 by contact 48.

Figure 2:
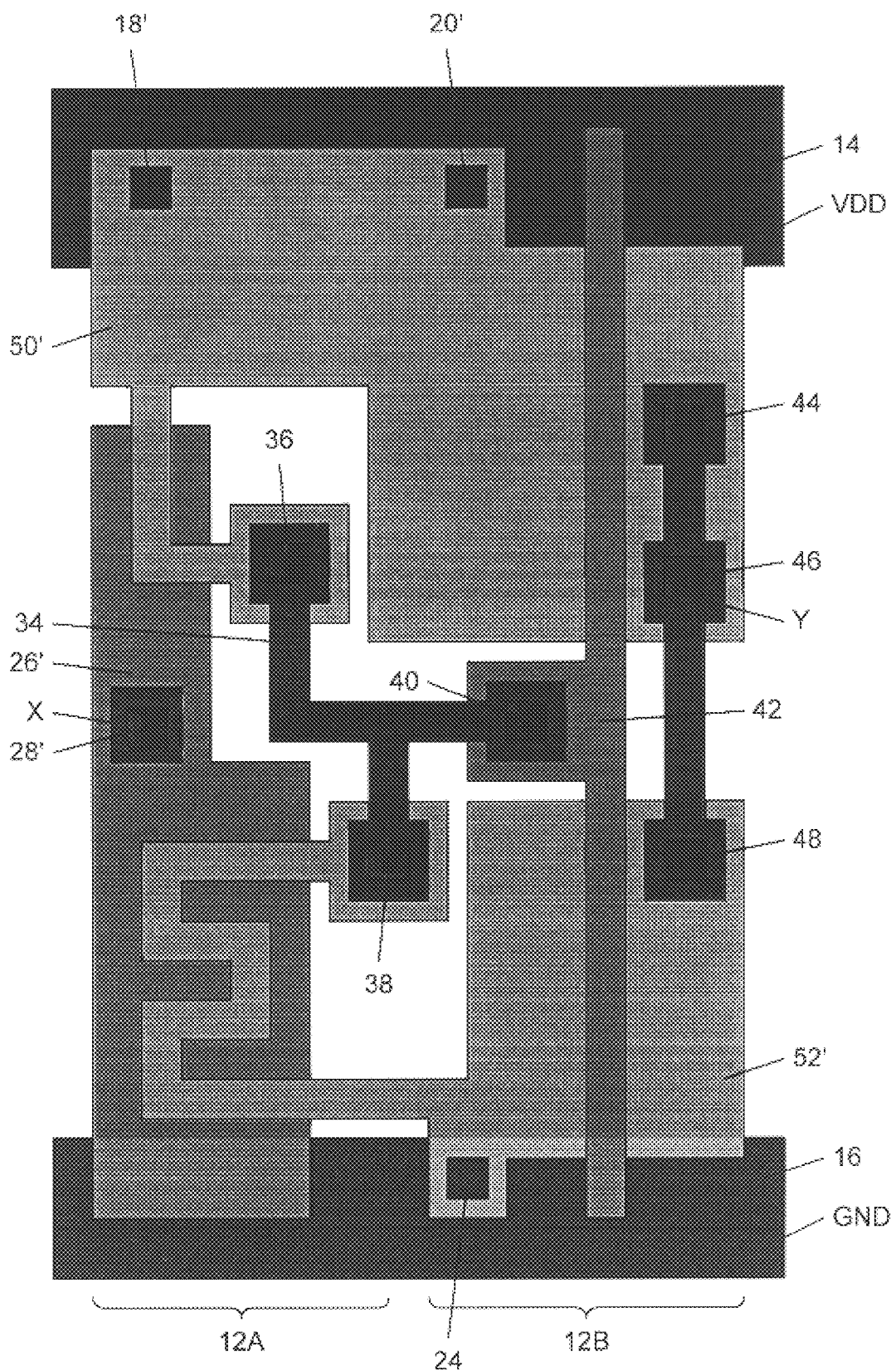
FIG. 2 is a modified semiconductor layout pattern of FIG. 1D having an increased propagation delay due to increased n- and p-gate lengths in accordance with the present invention.

FIG. 2 shows a semiconductor layout diagram of the buffer cell of FIG. 1D after it has been modified. It is noted that FIGS. 1D and 2 are visual representations of data representing delay circuits to be formed on silicon substrate. Modification as used in this description relates to the manipulation of data which represents the geometric features of the circuits.

In this example, polysilicon layer 26 and diffusion layer 52 from FIG. 1D have been modified to polysilicon layer 26' and diffusion layer 52' respectively. By modifying these layers, the p-channel gate and n-channel gate of inverter 12A, now defined by the overlap of polygate 26' with diffusion layers 50' and 52', respectively, are lengthened. These longer lengths cause the circuit represented by the cell in FIG. 2 to delay signal transmission between input X and output Y for a longer period of time than the circuit represented by the cell in FIG. 1D. However, the silicon areas containing the circuits represented by the cells shown in FIGS. 1D and 2, are equal or substantially equal.

Figure 3:
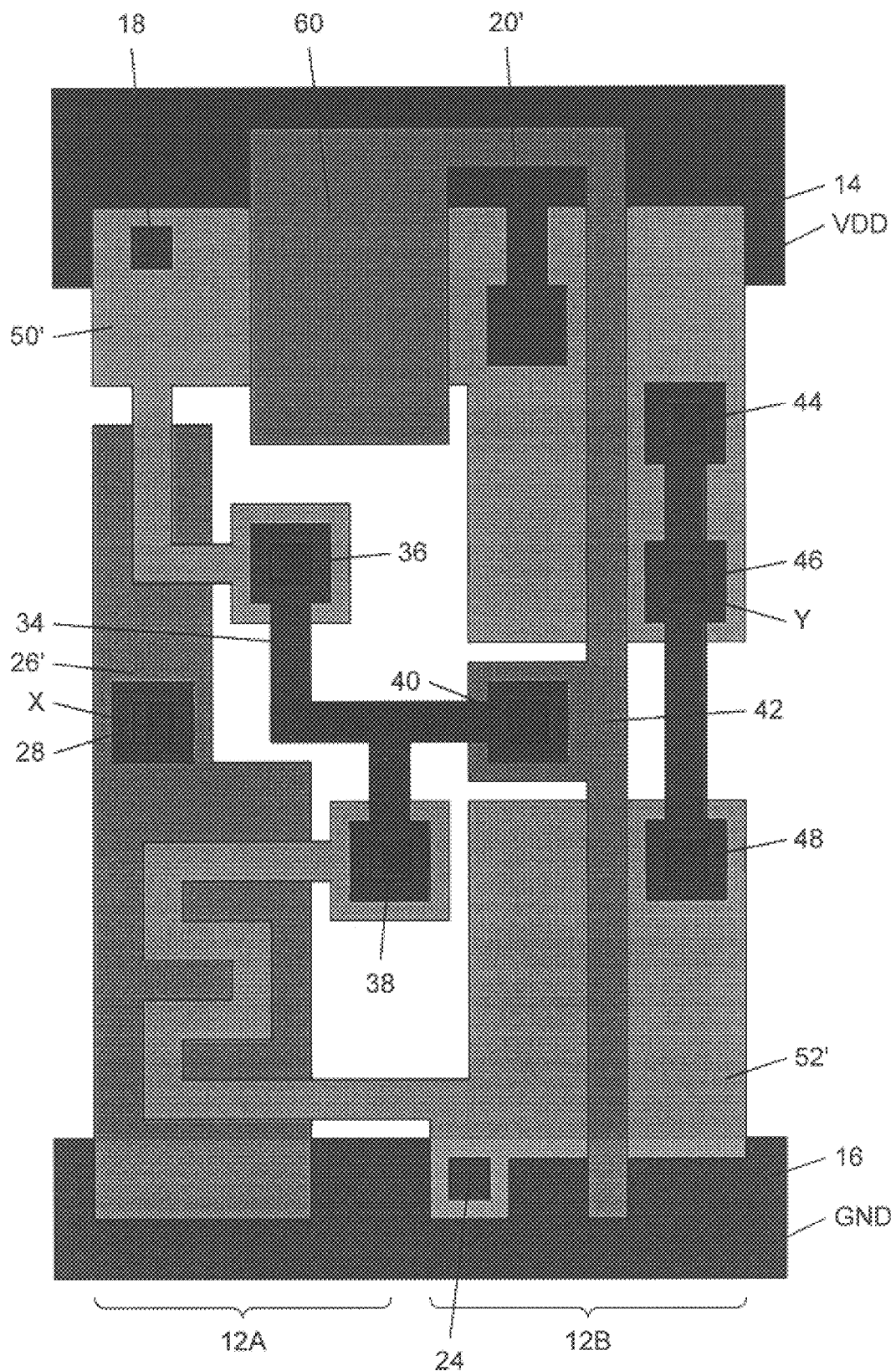
FIG. 3 is a modified semiconductor layout pattern of FIG. 2 having an even greater propagation delay due to an added capacitor in accordance with the present invention.

In FIG. 3, the cell of FIG. 2 is further modified to include a capacitor 60. The inclusion of this capacitor causes this cell to have a greater delay than FIGS. 1D and 2. Again, the silicon areas occupied by the cells shown in FIGS. 1D, 2 and 3 are equal or substantially equal.

Figures 4, 5:
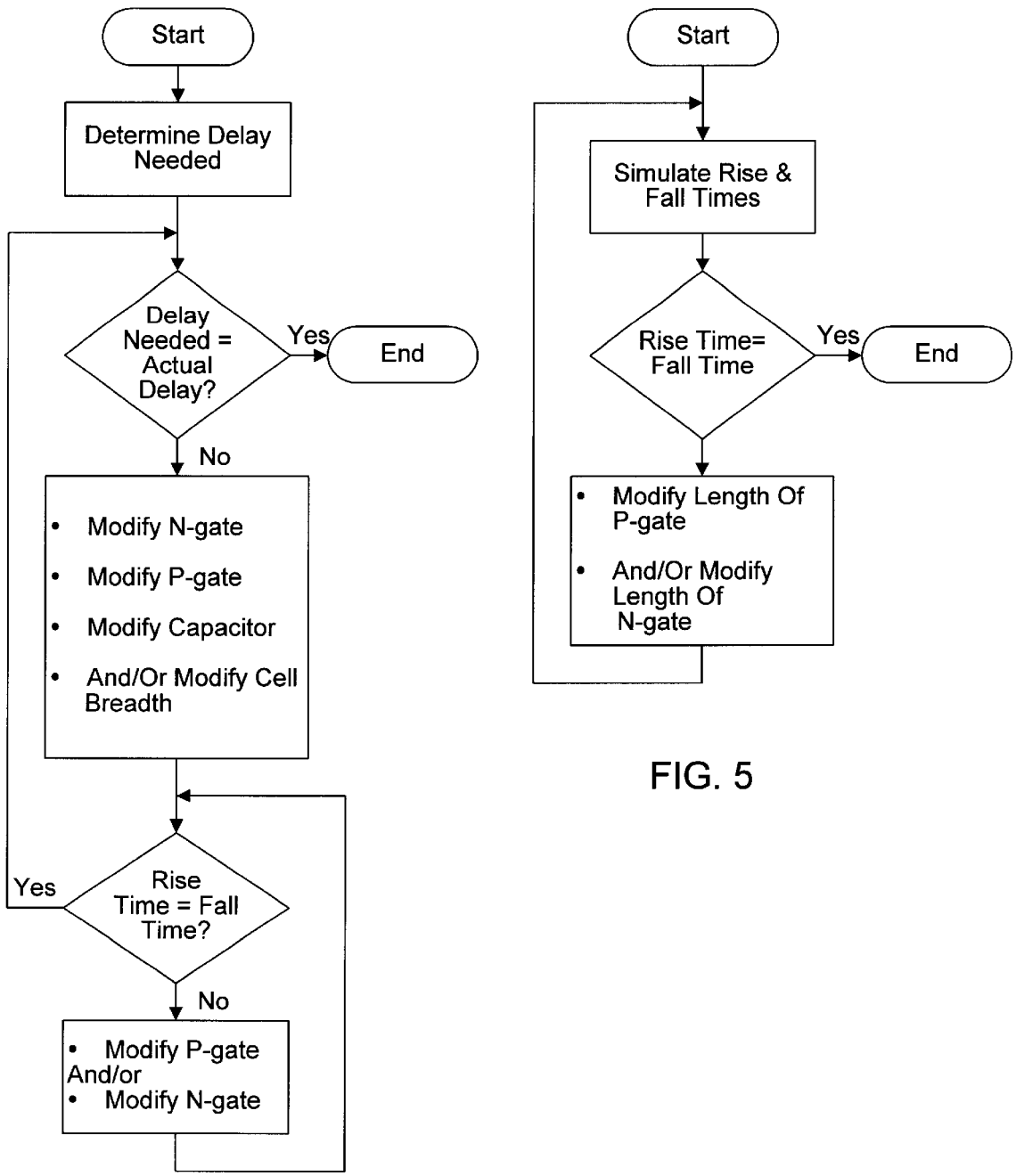
FIG. 4 is a flowchart for a method of designing a buffer circuit to have a certain delay.
FIG. 5 is a flowchart for balancing the rise and fall time of a CMOS inverter.

In FIG. 4, a flowchart shows how to modify the p-channel and n-channel gates of the transistors comprising the first inverter 12A of the buffer cell, such as that in FIG. 1D, to create a delay cell having increased time delay. The breadth of the cell and the size of the optional capacitor (such as the one shown in FIG. 3) can also be modified. Changing the breadth of the cell allows more room for increasing the other variables, such as gate length and capacitor size which in turn increases the circuit delay. In the first step, the designer calculates the amount of delay sought, for example, to correct a timing violation. Then, the actual delay of the cell is compared to the amount of delay needed. If these two are not equal, the designer has several options: the designer can modify the length and/or width of the n-channel gate, the length and/or width of the p-channel gate, and/or the size of the optional capacitor. Next, the rise and fall time of the n- and p-channel transistors are balanced, either by modifying the p-channel gate, the n-channel gate, or both (See FIG. 5). Then, the designer could once again compare the delay sought with the actual delay. This may be done through a computer simulation of signal propagation through the circuit. If these are not equal, the process is repeated until the delay sought and the actual delay are equal.

In FIG. 5, a flowchart shows a method for balancing the rise and fall time of the two transistors that make up an inverter. First, the actual rise and fall times are simulated. If these are not equal, the lengths of either the p-channel gate, n-channel gate, or both can be modified. Then, the actual rise and fall times can be simulated again. This process repeats until the rise and fall times are equal or substantially equal. The widths of the n- and p-channel gates can also be modified in the modification phase.

Figure 6A:
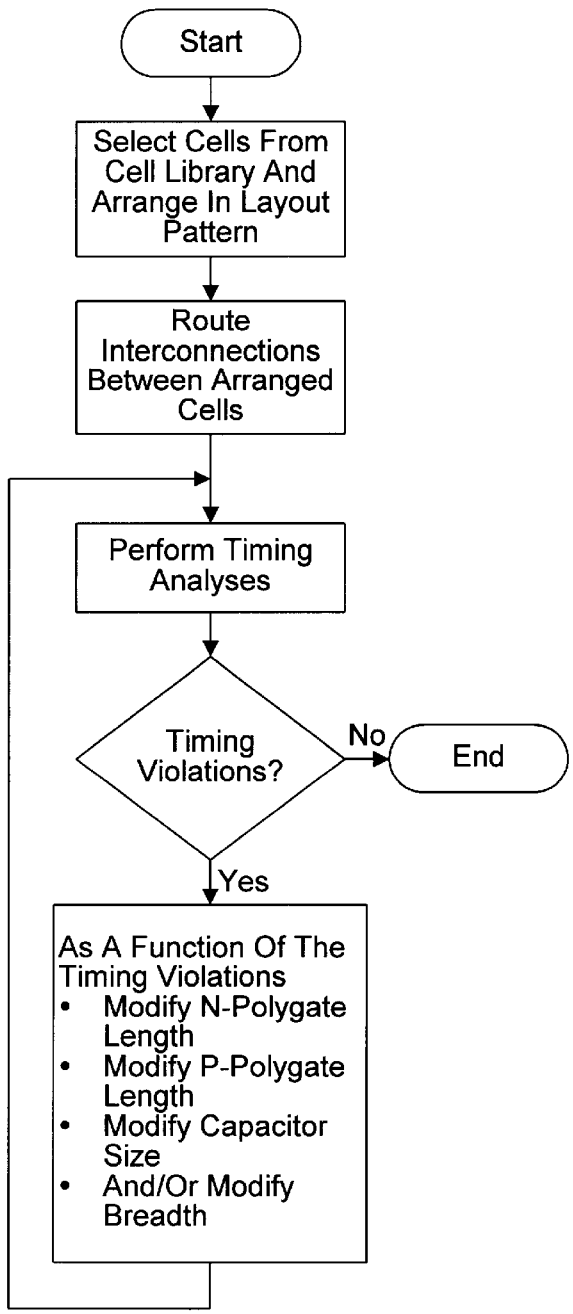
FIG. 6A is a flowchart for an iterative method of fixing timing violations using a library that contains cells having variable delays.

FIG. 6A presents an iterative method of fixing timing violations using a library containing cells that have variable delays. The cells have variable delays as a result of having variable n-and p-channel gate lengths. These cells possibly also have variable gate widths, optional capacitors of variable size, and/or variable breadths, too.

The first step in this method is to select the cells from the cell library and arrange them in a layout pattern. Then, interconnections are routed between the arranged cells. Once the connections are in place, a timing analysis determines whether there are any timing violations. If timing violations do exist, the variables can be adjusted so that the delays of the cells change to remedy the timing violation. Thus, the delay could be increased or decreased depending on what timing violation occurred. For example, if there was a hold time violation, the delay of a cell in the signal path containing the hold time violation could be increased to remove the violation. Once the variables have been changed, the timing analysis and determination of whether timing violations occurred is repeated. This process continues iteratively until there are no timing violations.

Figure 6B:
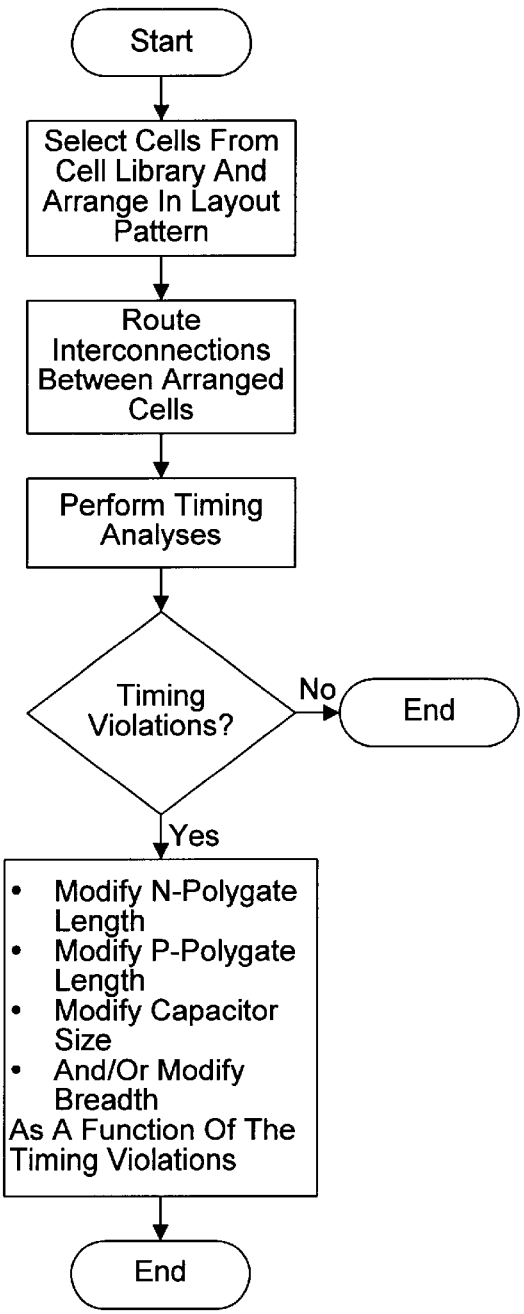
FIG. 6B is a flowchart for another method of fixing timing violations using a library that contains cells having variable delays.

An alternate method of fixing timing violations using the same library FIG. 6A is presented in FIG. 6B. Here, the process is not iterative. Instead, the variable(s) are modified a single time as a function of the delay needed.

Figure 7A:
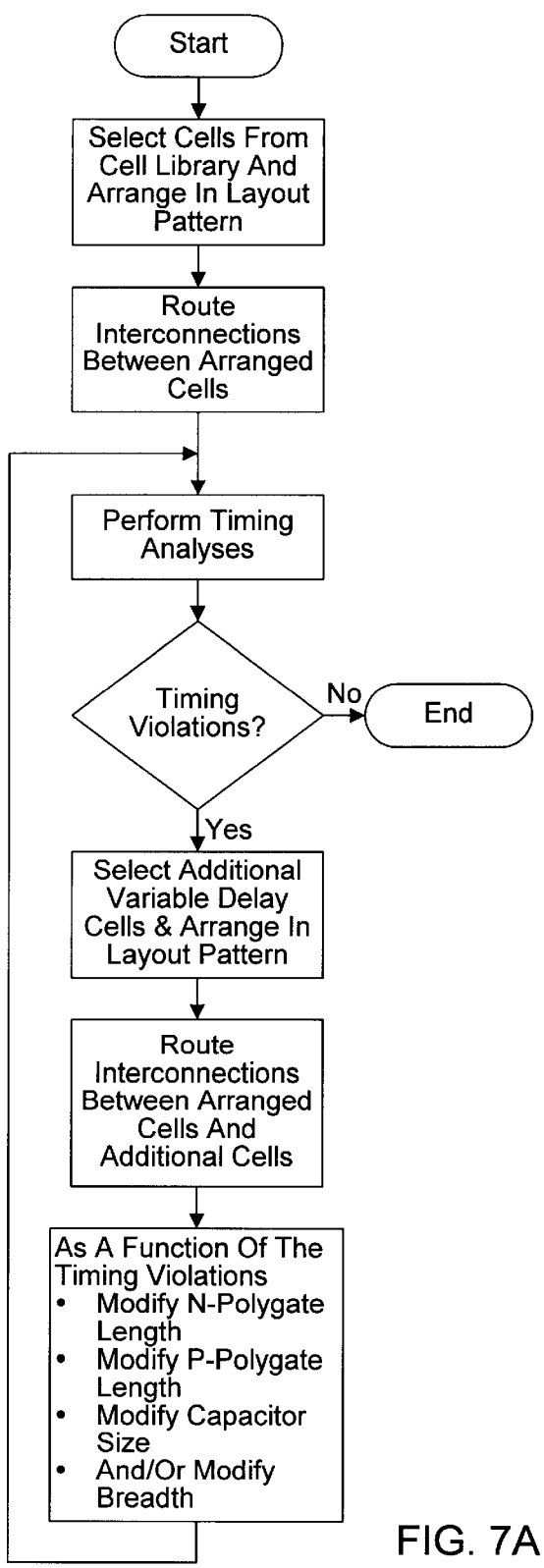
FIG. 7A is a flowchart for an iterative method of fixing timing violations using a library that allows delay cells having variable delays to be placed within a circuit to correct the violations.

FIG. 7A shows a method for fixing timing violations using a slightly different cell library than that used in FIGS. 6A and 6B. This cell library contains different types of logic cells, including delay cells with variable delays. These delay cells might not perform any logical function themselves. For example, these delay cells might represent buffer circuits, which would simply delay transmission of a signal by a certain time. The delay cells have variable delays as a result of having variable n- and p-channel transistor gate lengths, and possibly variable widths, optional capacitors with variable size, and/or variable breadths, too.

The first step in this method is to select the logic cells from the cell library and arrange them in a layout pattern. Then, interconnections are routed between the arranged cells. Once the connections are in place, a timing analysis determines whether there are any timing violations. If timing violations do exist, the delay cells can be inserted along the signal paths wherever necessary to correct these timing violations. The variable delays of the delay cells can then be adjusted to remedy the timing violation. Once the delay cells have been inserted and the variables have, if necessary, been changed, the timing analysis and determination of whether timing violations occurred is repeated. This process continues iteratively until there are no timing violations.

Figure 7B:
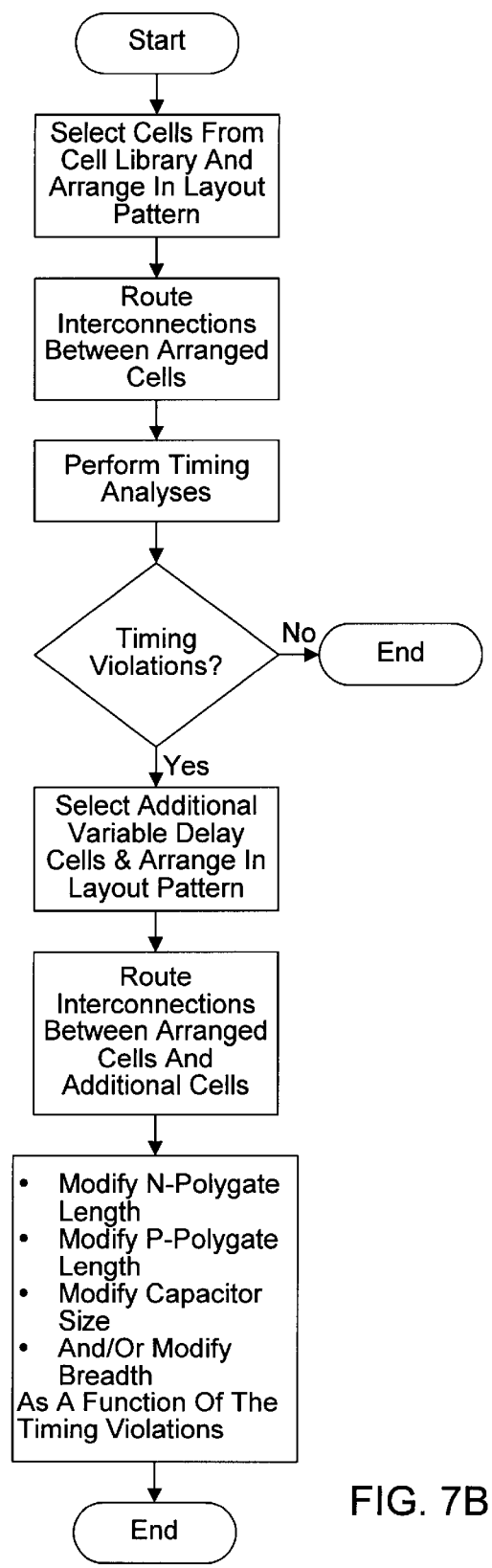
FIG. 7B is a flowchart for another method of fixing timing violations using a library that allows delay cells having variable delays to be placed within a circuit to correct the violations.

An alternate method of fixing timing violations using the same library FIG. 7A used is presented in FIG. 7B. Here, the process is not iterative. Instead, the delay cells are inserted and their variable(s) are modified a single time as a function of the delay needed.

While the present invention has been described with reference to particular embodiments, it will be understood that the embodiments are illustrated and that the invention scope is not so limited. Any variations, modifications, additions and improvements to the embodiments described are possible. These variations, modifications, additions and improvements may fall within the scope of the invention as detailed within the following claims.

What is claimed is:

1. A method comprising:
   generating a first data cell comprising first data, wherein the first data represents a first delay circuit having a first signal propagation delay between signal input and signal output of the first delay circuit, wherein the first delay circuit is configured to be contained within a first area on a silicon substrate, wherein the first area is larger than an area occupied by the first circuit;
   storing the first data cell in a memory;
   generating a second data cell comprising second data, wherein the second data represents a second delay circuit having a second signal propagation delay between signal input and signal output of the second delay circuit, wherein the second delay circuit is configured to be contained within a second area on silicon substrate, wherein the second area is larger than an area occupied by the second circuit;
   storing the second data cell in memory;
   wherein the first signal propagation delay is different than the second signal propagation delay;
   wherein the first area is equal in size to the second area; and
   wherein the first delay circuit comprises a first n-channel transistor coupled to a first p-channel transistor, wherein the second delay circuit comprises a second n-channel transistor coupled to a second p-channel transistor, and wherein the second delay circuit further comprises a capacitor coupled to the second n-channel and p-channel transistors.

2. The method of claim 1 wherein the first area is defined by a first length and a first width, wherein the second area is defined by a second length and a second width, wherein the first width is equal to the second width, and wherein the first length is equal to the second length.

3. The method of claim 1 wherein the first n-channel transistor comprises a first n-channel gate having a first n-channel gate length and a first n-channel gate width, wherein the second n-channel transistor comprises a second n-channel gate having a second n-channel gate length and a second n-channel gate width, and wherein the first n-channel gate length is longer than the second n-channel gate length.

4. The method of claim 3 wherein one of the first and second n-channel gates comprises first and second portions, wherein the first portion is physically connected to the second portion, and wherein the second portion extends from the first portion at a non-zero angle.

5. The method of claim 1 wherein the first n-channel transistor comprises a first n-channel gate, wherein the second n-channel transistor comprises a second n-channel gate, and wherein one of the first and second n-channel gates is defined by a serpentine pattern.

6. A method comprising:
   reading a library cell from memory of a computer system, wherein the library cell comprises data representing a circuit;
   modifying the library cell, wherein the modified library cell represents the circuit with at least one modification thereto;
   storing the modified library cell in memory;
   wherein the circuit, when implemented on silicon substrate, is contained within a first area on silicon substrate, wherein the first area is larger than an area on silicon substrate occupied by the circuit, wherein the circuit, when implemented on silicon substrate, is configured to delay signal propagation by a first propagation delay time;
   wherein the circuit with the at least one modification thereto, when implemented on silicon substrate, is contained within an area the same size as the first area when the circuit with the at least one modification thereto is implemented on silicon substrate, wherein the first area is larger than an area on silicon substrate occupied by the circuit with the at least one modification thereto, wherein the circuit with the at least one modification thereto, when implemented on silicon substrate, is configured to delay signal propagation by a second propagation delay time, wherein the first propagation delay time is greater than the second propagation delay time; and wherein the circuit comprises a first n-channel transistor coupled to a first p-channel transistor, wherein the circuit with the at least one modification thereto comprises a second n-channel transistor coupled to a second p-channel transistor, and wherein the circuit with the at least one modification thereto further comprises a capacitor coupled to the second n-channel and p-channel transistors.

7. The method of claim 6 wherein the library cell comprises first n-channel transistor data representing the first n-channel transistor of the circuit, wherein the first n-channel transistor data comprises first n-channel gate data representing a first n-channel gate of the first n-channel transistor, wherein the first n-channel gate data comprises first n-channel gate width data and first n-channel gate length data representing a first width of the n-channel gate and a first length of the n-channel gate, respectively, and wherein modifying the library cell to create the modified library cell comprises replacing the first n-channel gate length data with second n-channel gate length data.

8. The method of claim 7 wherein the circuit with the at least one modification thereto comprises the circuit with the first n-channel gate length extended or shortened to a second n-channel gate length, wherein the second n-channel gate length data represents the second n-channel gate length.

9. The method of claim 7 wherein the library cell further comprises p-channel transistor data representing the first p-channel transistor coupled to the first n-channel transistor, wherein the first p-channel transistor data comprises first p-channel gate data representing a first p-channel gate, wherein the first p-channel gate data comprises first p-channel gate length data and first p-channel width data representing a first length and a first width of the first p-channel gate, respectively, and wherein modifying the library cell to create the modified library cell further comprises replacing the first p-channel gate length data with a second p-channel gate length data.

10. The method of claim 9 wherein the circuit with the at least one modification thereto comprises the circuit with the first p-channel gate length extended or shortened to a second p-channel gate length and with the first n-channel gate length extended or shortened to the second n-channel gate length, wherein the second p-channel gate length data represents the second p-channel gate length and wherein the second n-channel gate length data represents the second n-channel gate length.

11. The method of claim 10 wherein a fall time of the first n-channel transistor with the first n-channel gate length extended or shortened to the second n-channel gate length equals a rise time of the p-channel transistor with the first p-channel length extended or shortened to the second p-channel length.

12. The method of claim 7 wherein modifying the library cell to create the modified library cell further comprises replacing the first n-channel gate width data with a second n-channel gate width data.

13. The method of claim 12 wherein the circuit with the at least one modification thereto comprises the circuit with the first n-channel gate length extended or shortened to a second n-channel gate length and with the first n-channel gate width extended or shortened to a second n-channel gate width, wherein the second n-channel gate length data represents the second n-channel gate length and the second n-channel gate width data represents the second n-channel gate width.

14. The method of claim 12 wherein the library cell further comprises p-channel transistor data representing the first p-channel transistor coupled to the first n-channel transistor, wherein the first p-channel transistor data comprises first p-channel gate data representing a first p-channel gate, wherein the first p-channel gate data comprises first p-channel gate length data and first p-channel width data representing a first length and a first width of the first p-channel gate, respectively, and wherein modifying the library cell to create the modified library cell further comprises replacing the first p-channel gate width data with a second p-channel gate width data and replacing the first p-channel gate length data with a second p-channel gate length data.

15. The method of claim 14 wherein the circuit with the at least one modification thereto comprises the circuit with the first n-channel gate length extended or shortened to a second n-channel gate length and with the first n-channel gate width extended or shortened to a second n-channel gate length, wherein the second n-channel gate length data represents the second n-channel gate length and the second n-channel gate width data represents the second n-channel gate width.

16. The method of claim 9 wherein the library cell further comprises first capacitor data representing a first capacitor coupled to the first n- and p-channel transistors, wherein the first capacitor is defined by a first capacitance size, and wherein modifying the library cell comprises replacing the first capacitor data with second capacitor data.

17. The method of claim 6 wherein the length of the first n-channel transistor extends linearly over a diffusion area when the circuit is implemented on silicon, wherein the first n-channel gate length extended or shortened to the second n-channel gate length is defined by a serpentine pattern.

18. The method of claim 6 wherein the circuit is defined by a buffer circuit.

19. The method of claim 6 wherein the circuit is defined by an inverter.

20. A computer readable memory for storing library cells readable by a computer, wherein the library cells are useful in computer aided design of integrated circuits, the library of cells comprising:

a first cell representing a first delay circuit, wherein the first delay circuit, when formed on a semiconductor substrate, is configured to delay signal transmission between an input and an output of the first delay circuit by a first time period, wherein the first delay circuit is configured to be contained within a first area on a silicon substrate, wherein the first area is larger than an area occupied by the first delay circuit;

a second cell representing a second delay circuit, wherein the second delay circuit, when formed on the semiconductor substrate, is configured to delay signal transmission between an input and output of the second circuit by a second time period, wherein the second delay circuit is configured to be contained within a second area on silicon substrate, wherein the second area is larger than an area occupied by the second delay circuit;

wherein the first time period is different than the second time period;

wherein the first area is substantially equal in size to the second area; and wherein the first delay circuit comprises a first n-channel transistor coupled to a first p-channel transistor, wherein the second delay circuit comprises a second n-channel transistor coupled to a second p-channel transistor, and wherein the second delay circuit further comprises a capacitor coupled to the second n-channel and p-channel transistors.

21. The computer readable medium of claim 20, wherein the first area is defined by a first height and a first breadth, wherein the second area is defined by a second height and a second breadth, and wherein the first height is substantially equal to the second height.

22. The computer readable medium of claim 20 wherein the first n-channel transistor comprises a first n-channel gate defined by a first length and a first width, and wherein a fall time of the first n-channel transistor is substantially equal to a rise time of the first p-channel transistor;

wherein the second n-channel transistor comprises a second n-channel gate defined by a second length and a second width, and wherein a fall time of the second n-channel transistor is substantially equal to a rise time of the second p-channel transistor; and wherein the first length is different than the second length.

23. The computer readable medium of claim 20 wherein the first delay circuit further comprises a first capacitor coupled to the first n-channel and first p-channel transistors and wherein the first capacitor is defined by a first capacitor size.

24. The computer readable medium of claim 23 wherein the capacitor coupled to the second n-channel and second p-channel transistors is defined by a second capacitor size.

25. The computer readable medium of claim 24 wherein the first capacitor size is different than the second capacitor size.

26. The computer readable medium of claim 21 wherein the first breadth is different than the second breadth.

27. A method comprising:

generating a first data cell comprising first data, wherein the first data represents a first delay circuit having a first signal propagation delay between signal input and signal output of the first delay circuit, wherein the first delay circuit is configured to be contained within a first area on a silicon substrate, wherein the first area is larger than an area occupied by the first circuit;

storing the first data cell in a memory;

generating a second data cell comprising second data, wherein the second data represents a second delay circuit having a second signal propagation delay between signal input and signal output of the second delay circuit, wherein the second delay circuit is configured to be contained within a second area on silicon substrate, wherein the second area is larger than an area occupied by the second circuit;

storing the second data cell in memory;

wherein the first signal propagation delay is different than the second signal propagation delay;

wherein the first area is equal in size to the second area;

wherein the first delay circuit comprises a first n-channel transistor, wherein the first n-channel transistor comprises a first n-channel gate having a first n-channel gate length and a first n-channel gate width, wherein the second delay circuit comprises a second n-channel transistor, wherein the second n-channel transistor comprises a second n-channel gate having a second n-channel gate length and a second n-channel gate width, and wherein the first n-channel gate length is longer than the second n-channel gate length; and wherein one of the first and second n-channel gates comprises first and second portions, wherein the first portion is physically connected to the second portion, and wherein the second portion extends from the first portion at a non-zero angle.

28. The method of claim 27 wherein one of the first and second n-channel gates is defined by a serpentine pattern.

29. A computer readable memory for storing library cells readable by a computer, the library of cells comprising:

a first cell representing a first delay circuit, wherein the first delay circuit, when formed on a semiconductor substrate, is configured to delay signal transmission between an input and an output of the first delay circuit by a first time period, wherein the first delay circuit is configured to be contained within a first area on a silicon substrate, wherein the first area is larger than an area occupied by the first delay circuit;

a second cell representing a second delay circuit, wherein the second delay circuit, when formed on the semiconductor substrate, is configured to delay signal transmission between an input and output of the second circuit by a second time period, wherein the second delay circuit is configured to be contained within a second area on silicon substrate, wherein the second area is larger than an area occupied by the second delay circuit;

wherein the first time period is greater than the second time period;

wherein the first area is substantially equal in size to the second area;

wherein the first delay circuit comprises a first n-channel transistor, wherein the first n-channel transistor comprises a first n-channel gate having a first n-channel gate length and a first n-channel gate width, wherein the second delay circuit comprises a second n-channel transistor, wherein the second n-channel transistor comprises a second n-channel gate having a second n-channel gate length and a second n-channel gate width, and wherein the first n-channel gate length is longer than the second n-channel gate length; and wherein one of the first and second n-channel gates comprises first and second portions, wherein the first portion is physically connected to the second portion, and wherein the second portion extends from the first portion at a non-zero angle.

30. The computer readable medium of claim 29 wherein the first delay circuit further comprises a first p-channel transistor coupled to the first n-channel transistor first n-channel transistor comprises a first n-channel gate defined by a first length and a first width, and wherein a fall time of the first n-channel transistor is substantially equal to a rise time of the first p-channel transistor;

wherein the second delay circuit further comprises a second p-channel transistor coupled to the second n-channel transistor, wherein said second n-channel transistor comprises a second n-channel gate defined by a second length and a second width, and wherein a fall time of the second n-channel transistor is substantially equal to a rise time of the second p-channel transistor; and wherein the first length is different than the second length.

31. The computer readable medium of claim 29 wherein the first delay circuit further comprises a first capacitor coupled to the first n-channel and first p-channel transistors and wherein the first capacitor is defined by a first capacitor size;

wherein the second delay circuit further comprises a second capacitor coupled to the second n-channel and second p-channel transistors and wherein the second capacitor is defined by a second capacitor size;

wherein the first capacitor size is different than the second capacitor size.

* * * * *